United States Patent
Schrei et al.

(10) Patent No.: US 10,819,352 B2
(45) Date of Patent: Oct. 27, 2020

(54) OUTPUT CIRCUIT AND METHOD FOR PROVIDING AN OUTPUT CURRENT

(71) Applicant: ams AG, Premstaetten (AT)

(72) Inventors: Thomas Schrei, Fernitz (AT); Vida Uhde-Djefroudi, Graz (AT)

(73) Assignee: ams AG, Premstaetten (AT)

( * ) Notice: Subject to any disclaimer, the term of this patent is extended or adjusted under 35 U.S.C. 154(b) by 0 days.

(21) Appl. No.: 16/471,723

(22) PCT Filed: Jan. 17, 2018

(86) PCT No.: PCT/EP2018/051089
§ 371 (c)(1),
(2) Date: Jun. 20, 2019

(87) PCT Pub. No.: WO2018/134240
PCT Pub. Date: Jul. 26, 2018

(65) Prior Publication Data
US 2019/0334532 A1    Oct. 31, 2019

(30) Foreign Application Priority Data
Jan. 18, 2017  (EP) .................................... 17152006

(51) Int. Cl.
*H03L 7/089* (2006.01)
*G05F 1/56* (2006.01)
*G05F 3/26* (2006.01)

(52) U.S. Cl.
CPC .............. *H03L 7/0898* (2013.01); *G05F 1/56* (2013.01); *G05F 3/262* (2013.01)

(58) Field of Classification Search
CPC ... H03L 7/0898; H03L 7/0896; H03L 7/0895; H03L 7/0893; H03L 7/0891

USPC .................. 327/108–112; 326/82, 83, 86, 87
See application file for complete search history.

(56) References Cited

U.S. PATENT DOCUMENTS

| | | |
|---|---|---|
| 5,453,680 A | 9/1995 | Giolma et al. |
| 5,923,183 A * | 7/1999 | Kim ................. H03K 19/00361 |
| | | 326/27 |
| 5,952,884 A | 9/1999 | Ide |
| 6,573,752 B1 * | 6/2003 | Killat .................. H03K 17/102 |
| | | 326/63 |
| 6,844,774 B1 | 1/2005 | Hood |
| 8,193,843 B1 | 6/2012 | Stegmeir |
| 9,229,462 B2 | 6/2016 | Shukla et al. |
| 2002/0089382 A1 * | 7/2002 | Yang ..................... H03L 7/0895 |
| | | 331/17 |
| 2007/0109031 A1 | 5/2007 | Lin et al. |

(Continued)

FOREIGN PATENT DOCUMENTS

| | | |
|---|---|---|
| CN | 104635836 A | 5/2015 |
| EP | 3057236 | 8/2016 |

OTHER PUBLICATIONS

European Patent Office, International Search Report PCT/EP2018/051089, dated Mar. 26, 2018.

(Continued)

*Primary Examiner* — Tomi Skibinski
(74) *Attorney, Agent, or Firm* — Fish & Richardson P.C.

(57) ABSTRACT

An output circuit comprises an output terminal (11), a first current mirror (12), a first pass transistor (13) and a first delivering terminal (14) coupled via the first current mirror (12) and the first pass transistor (13) to the output terminal (11).

16 Claims, 6 Drawing Sheets

(56) References Cited

U.S. PATENT DOCUMENTS

| | | | |
|---|---|---|---|
| 2007/0296463 A1* | 12/2007 | Illegems | H03K 19/018507 |
| | | | 326/83 |
| 2008/0088342 A1 | 4/2008 | Lee et al. | |
| 2012/0206123 A1* | 8/2012 | Mulligan | H02M 3/155 |
| | | | 323/313 |
| 2016/0013730 A1 | 1/2016 | Neri | |

OTHER PUBLICATIONS

China National Intellectual Property Administration, Office Action issued in Chinese Application No. 201880007141.2, dated Apr. 23, 2020 (with English Translation), 21 pages.

\* cited by examiner

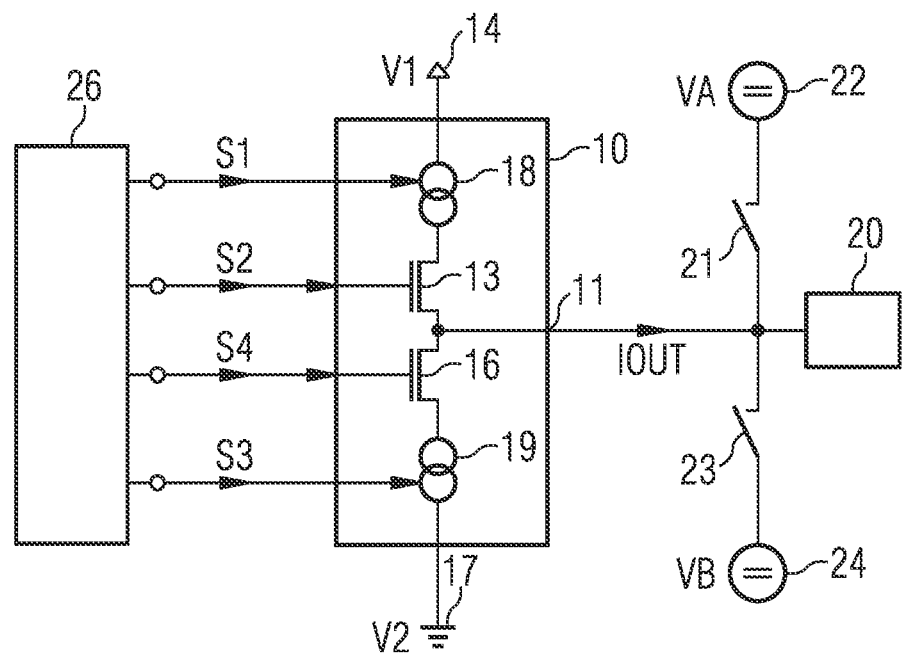
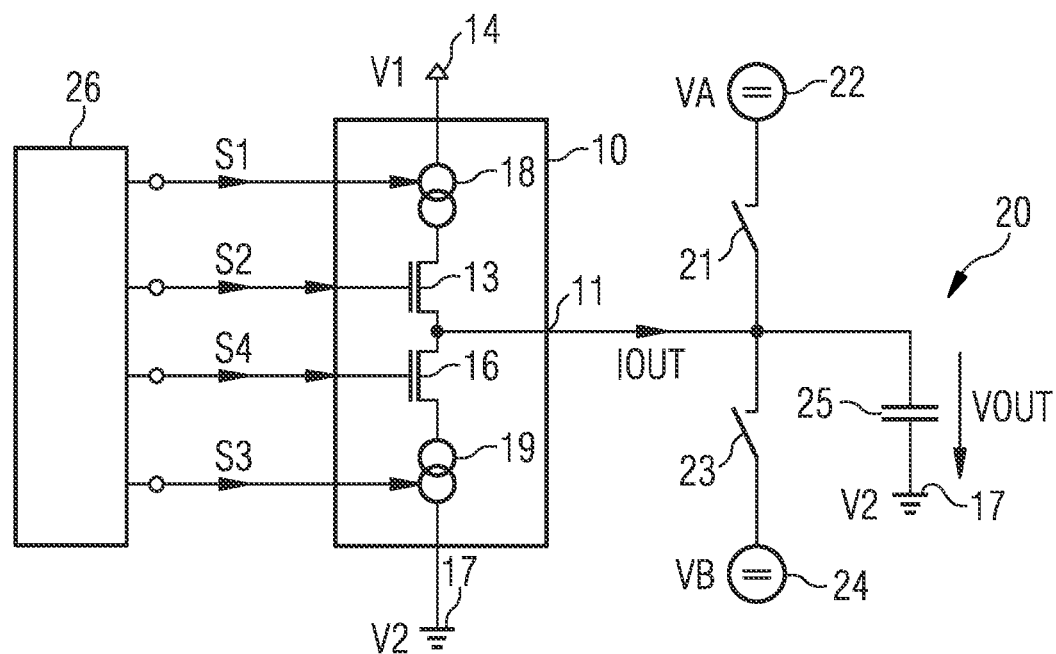

OUTPUT CIRCUIT AND METHOD FOR PROVIDING AN OUTPUT CURRENT

CROSS-REFERENCE TO RELATED APPLICATIONS

The present application is the national stage entry of International Patent Application No. PCT/EP2018/051089, filed on Jan. 17, 2018, which claims the benefit of priority of European Patent Application No. 17152006.7, filed on Jan. 18, 2017, all of which are hereby incorporated by reference in their entirety for all purposes.

BACKGROUND OF THE INVENTION

The present patent application is related to an output circuit and a method for providing an output current.

An output circuit may be realized as a current sink or current source. The output circuit provides an output current at an output terminal. Further circuit parts are coupled to the output terminal and may apply a signal to the output terminal. Thus, the influence of further parts on the output circuit has to be kept low.

SUMMARY OF THE INVENTION

In an embodiment, an output circuit comprises an output terminal, a first current mirror, a first pass transistor and a first delivering terminal. The first delivering terminal is coupled via the first current mirror and the first pass transistor to the output terminal.

Advantageously, the first pass transistor is implemented to reduce the influence of signals provided from other circuit parts to the output terminal on the output circuit.

In an embodiment, the first current mirror is connected to the first delivering terminal. The first pass transistor is connected to the output terminal.

In an embodiment, the first current mirror is directly and permanently connected to the first pass transistor. The first pass transistor may be directly and permanently connected to the output terminal. The first current mirror may be directly and permanently connected to the first delivering terminal.

In an embodiment, the coupling of the first delivering terminal to the output terminal is free from any transistor, diode, resistor or other circuit part besides the first current mirror and the first pass transistor.

In an embodiment, the first current mirror comprises a first mirror transistor and a further mirror transistor. A first terminal of the first mirror transistor and a first terminal of the further mirror transistor are connected to the first delivering terminal. A control terminal of the first mirror transistor is connected to a control terminal of the further mirror transistor. A series circuit of the first mirror transistor and of the first pass transistor couples the first delivering terminal to the output terminal.

In an embodiment, the coupling of the first delivering terminal to the output terminal is realized by a series circuit of a controlled section of the first mirror transistor and of a controlled section of the first pass transistor. This coupling may be free of a controlled section of a further transistor.

In an embodiment, the output circuit comprises a first mirror source that is connected to a second terminal of the further mirror transistor. The first mirror source controls the current through the further mirror transistor. If the first pass transistor is in a conducting state, the first mirror source controls a current flowing through the first mirror transistor and, thus, an output current flowing through the output terminal. The current flowing through the first mirror transistor may be equal to the output current flowing through the output terminal.

The first mirror source is realized as a current source. The first mirror source may be called first mirror current source.

In an embodiment, the number of transistors between the first current mirror and the output terminal is exactly one.

In an embodiment, the number of transistors between the first delivering terminal and the output terminal is exactly two.

In an embodiment, the first pass transistor is realized as a field-effect transistor. The first pass transistor has a bulk terminal that is connected to a first node between the first pass transistor and the first current mirror.

In an embodiment, a first node switch of the output circuit is arranged between a first common terminal and the first node between the first pass transistor and the first current mirror.

In an embodiment, a first control switch of the output circuit is arranged between the first common terminal and a control terminal of the first pass transistor.

In an embodiment, the output circuit comprises a first control path having a first series circuit of a first control transistor and at least a first diode. The first series circuit couples the control terminal of the first pass transistor to the first common terminal.

In an embodiment, a control terminal of the first control transistor is connected to the first node between the first pass transistor and the first current mirror.

In an embodiment, the first control path comprises a first current source that couples the first delivering terminal to the first series circuit.

In an embodiment, the output circuit is configured as a current source or a current sink or a combined current source and current sink.

In an embodiment, the first current mirror and the first pass transistor form a current source. Thus, the output circuit may be configured as a single current source. The output current flows from the output circuit via the output terminal to a load. The output current may have a positive value.

In a further development, the first delivering terminal is realized as a source terminal. The first current mirror may comprise at least two p-channel field effect transistors. The first current mirror may be implemented by p-channel field effect transistors. The first pass transistor may be implemented as an n-channel field-effect transistor.

In an embodiment, the first delivering terminal is coupled to the output terminal by a series circuit of an n-channel field effect transistor and a p-channel field effect transistor.

Advantageously, such a combination can achieve that a voltage at the output terminal may be higher than a voltage at the first delivering terminal.

In an embodiment, the channel types of the first pass transistor and of the first mirror transistor are different. The further mirror transistor and the first mirror transistor have the same channel type. Since the channel types of the first pass transistor and of the first mirror transistor are different, the first pass transistor may be able to block a current flowing through the output terminal.

In a further development, the output circuit comprises a second current mirror, a second pass transistor and a second delivering terminal coupled via the second current mirror and the second pass transistor to the output terminal. The second current mirror and the second pass transistor form a current sink. Thus, the output circuit may be configured as a combined current source and current sink.

In an alternative embodiment, the first current mirror and the first pass transistor form a current sink. Thus, the output circuit may be configured as a single current sink. The output current as defined above may have a negative value.

In the alternative embodiment, the first delivering terminal is realized as a sink terminal. The first current mirror may comprise at least two n-channel field-effect transistors. The first current mirror may be implemented by n-channel field-effect transistors. The first pass transistor may be implemented as a p-channel field-effect transistor. Advantageously, since the channel types of the first pass transistor and of the first mirror transistor are different, the first pass transistor may be able to block a current flowing through the output terminal.

In an embodiment, the output circuit is implemented as a general purpose high voltage current sink or source with arbitrary output potential. The output circuit may be fabricated by a high-voltage complementary metal-oxide-semiconductor process, short CMOS process.

In an embodiment, the output circuit allows overdriving the output terminal, when the output circuit is not turned on or protected with special devices. Thus, the output circuit allows overdriving the output terminal of a current source (sink) higher (lower) than the individual supply when the source/sink is not turned on or protected with special devices.

The output circuit enables switching the output terminal to any voltage allowed inside the process used regardless of the supply rail of the source (sink). No special external control signals or bias voltages or voltages provided externally are needed. The potential of the source (sink) can be the same or can be arbitrary. The output terminal may be called output node.

In an embodiment, the output circuit is configured such that the first pass transistor blocks the output current in an idle state of the output circuit, independent whether an output voltage that is tapped at the output terminal is higher or lower than a first voltage that is provided to the first delivering terminal.

In an embodiment, a method for providing an output current comprises controlling the output current by a first current mirror and a first pass transistor and providing the output current at the output terminal. The first current mirror and the first pass transistor are arranged between a first delivering terminal and an output terminal.

In an idle state of the output circuit, the output current is zero. However, a further circuit part that is coupled to the output terminal may apply an output voltage to the output terminal.

In an embodiment, the first pass transistor blocks the output current in the idle state of the output circuit, independent whether the output voltage is higher or lower than a first voltage that is provided to the first delivering terminal.

In an embodiment, the first pass transistor blocks the output current in the idle state of the output circuit, even if the output voltage is higher than the first voltage. This may be the case for example if the output circuit is configured as current source. Additionally, the first pass transistor blocks the output current in the idle state of the output circuit, if the output voltage is lower than the first voltage.

In an embodiment, the first pass transistor blocks the output current in the idle state of the output circuit, even if the output voltage is lower than a first voltage. This may be the case for example if the output circuit is configured as current sink. Additionally, the first pass transistor blocks the output current in the idle state of the output circuit, if the output voltage is higher than the first voltage.

BRIEF DESCRIPTION OF THE DRAWINGS

The following description of figures of exemplary embodiments may further illustrate and explain aspects of the disclosure. Devices and circuit parts with the same structure and the same effect, respectively, appear with equivalent reference symbols. In so far as devices or circuit parts correspond to one another in terms of their function in different figures, the description thereof is not repeated for each of the following figures.

FIGS. 1A and 1B show exemplary embodiments of an output circuit;

DETAILED DESCRIPTION

Figure 2A:
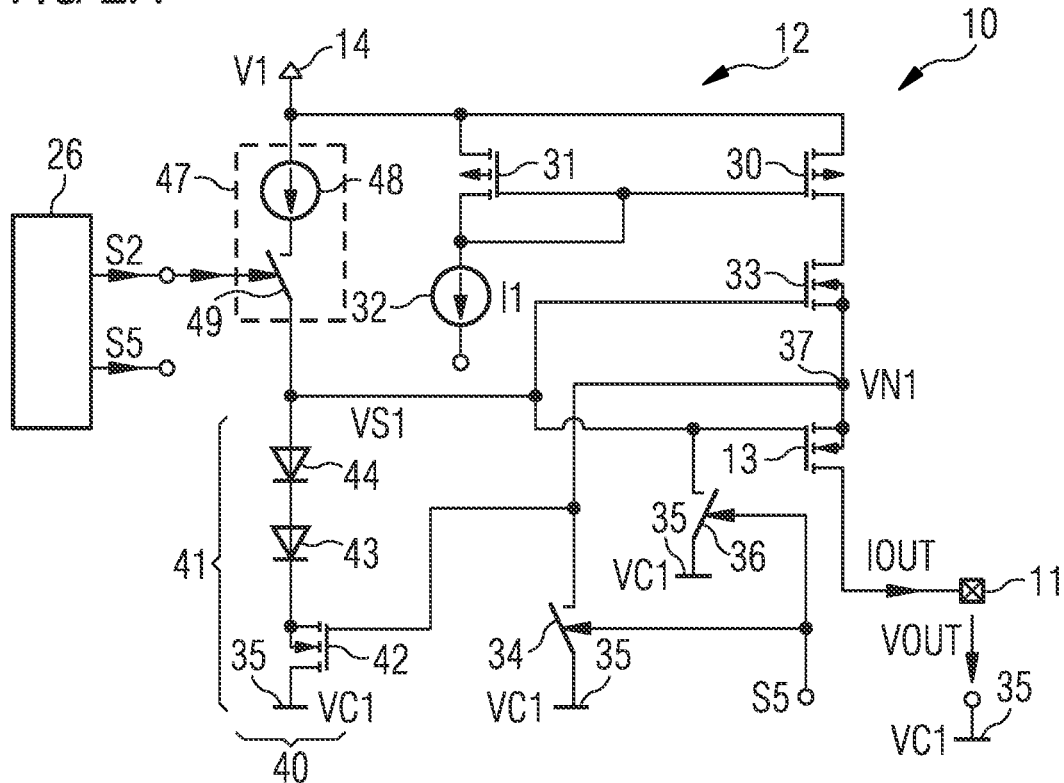
FIGS. 2A to 2C show three exemplary embodiments of an output circuit.

FIG. 1A shows an exemplary embodiment of an output circuit 10 comprising an output terminal 11, a first current source circuit 18, a first pass transistor 13 and a first delivering terminal 14. A series circuit of the first current source circuit 18 and the first pass transistor 13 couples the first delivering terminal 14 to the output terminal 11. The first pass transistor 13 and the first current source circuit 18 form a current source.

Moreover, the output circuit 10 may comprise a second current source circuit 19, a second pass transistor 16 and a second delivering terminal 17. A series circuit of the second pass transistor 16 and the second current source circuit 19 couples the second delivering terminal 17 to the output terminal 11. The second pass transistor 16 and the second current source circuit 19 form a current sink.

The output terminal 11 of the output circuit 10 may be coupled to a load 20. The load 20 may comprise at least a resistor and/or at least a capacitor. A first load switch 21 may couple the output terminal 11 to a first load voltage source 22. A second load switch 23 may couple the output terminal 11 to a second load voltage source 24.

An output current IOUT is provided at the output terminal 11. The output current IOUT may have positive or negative current values. The first current source circuit 18 is controlled by a first current control signal S1. The first pass transistor 13 is controlled by a first digital signal S2. The second current source circuit 19 is controlled by a second current control signal S3. Additionally, the second pass transistor 16 is controlled by a second digital signal S4.

The first load voltage source 22 generates a first load voltage VA. The second load voltage source 24 provides a second load voltage VB. A first voltage V1 is tapped at the first delivering terminal 14. A second voltage V2 is tapped at the second delivering terminal 17. The first voltage V1 may be positive in comparison to the second voltage V2.

In a source operating mode, the first digital signal S2 sets the first pass transistor 13 in a conducting state and the first current source circuit 18 provides the output current IOUT with a positive value. The first current control signal S1 controls the value of the output current IOUT. In the source operating mode, the second pass transistor 16 is set in a non-conducting state by the second digital signal S4.

In a sink operating mode, the second digital signal S4 sets the second pass transistor 16 in a conducting state. Thus, current can flow through the second current source circuit 19. Consequently, the output current IOUT has a negative value. The second current control signal S3 controls the value of the output current IOUT. In the sink operating mode, the first pass transistor 13 is set in a non-conducting state by the first digital signal S2.

Thus, in the source operating mode, the first and the second digital signal S2, S4 set the output circuit 10 such that the output circuit 10 is activated as a current source. The output current IOUT is positive. A positive output current IOUT is defined as an output current flowing from the output circuit 10 via the output terminal 11 to the load 20.

Moreover, in the sink operating mode, the first and the second digital signal S2, S4 set the output circuit 10 such that the output circuit 10 is activated as a current sink. The output current IOUT is negative.

In an example, the output terminal 11 may be realized as a pad or bond pad. The output terminal 11 may comprise a contact area.

In an example, the first delivering terminal 14 may be realized as a pad or bond pad. The first delivering terminal 14 may comprise a contact area.

In an example, the second delivering terminal 17 may be realized as a pad or bond pad. The second delivering terminal 17 may comprise a contact area.

FIG. 1B shows an exemplary embodiment of the output circuit 10 which is a further development of the embodiment shown in FIG. 1A. The load 20 comprises a capacitor 25 coupled to the output terminal 11. The capacitor 25 may couple the output terminal 11 to the second delivering terminal 17.

An output voltage VOUT can be tapped at the output terminal 11. Thus, the output voltage VOUT is applied between the electrodes of the capacitor 25. The output voltage VOUT may be tapped between the output terminal 11 and the second delivering terminal 17. By the output current IOUT, the capacitor 25 is charged and/or discharged. The output voltage VOUT may have the form of a ramp. A starting point of the ramp of the output voltage VOUT may be set, for example by the first load switch 21 and the first load voltage source 22. In case the output circuit 10 is activated as a current source, the ramp of the output voltage VOUT has a positive slope. In case the output circuit 10 is activated as a current sink, the ramp of the output signal VOUT has a negative slope.

The output circuit 10 is connected to the load 20 and to two load switches 21, 23. When the output circuit 10 is inactive, the load 20 can be driven/supplied to/from the first and the second load voltage source 22, 24 regardless of a voltage value of the first and the second load voltage VA, VB. When the output circuit 10 is active (load switches 21, 23 off), the output current IOUT flows to/from the load 20 via the output circuit 10. The output circuit 10 is implemented as a high-voltage source/sink. Thus, the output circuit 10 is a current source and/or sink that can withstand high voltages.

FIG. 2A shows a further exemplary embodiment of the output circuit 10 that is a further development of the embodiments shown in FIGS. 1A and 1B. The output circuit 10 comprises a first current mirror 12 and the first pass transistor 13 that are arranged in a current path between the output terminal 11 and the first delivering terminal 14. Thus, the first current source circuit 18 shown in FIGS. 1A and 1B is implemented as the first current mirror 12. The first current mirror 12 is connected to the first delivering terminal 14. The first current mirror 12 comprises a first mirror transistor 30 and a further mirror transistor 31. A first terminal of the first mirror transistor 30 and a first terminal of the further mirror transistor 31 are connected to the first delivering terminal 14. The control terminals of the first mirror transistor 30 and of the further mirror transistor 31 are connected to each other and to a second terminal of the further mirror transistor 31. Moreover, the output circuit 10 comprises a first mirror source 32 that is connected to the second terminal of the further mirror transistor 31.

The first mirror transistor 30 and the further mirror transistor 31 are realized as field-effect transistors. The first mirror transistor 30 and the further mirror transistor 31 may be fabricated as p-channel field-effect transistors.

The first pass transistor 13 is connected to the output terminal 11. Additionally, the output circuit 10 comprises a further pass transistor 33 that is arranged between the first pass transistor 13 and the first current mirror 12. A second terminal of the first mirror transistor 30 is coupled to a first terminal of the first pass transistor 13 via the further pass transistor 33. A second terminal of the first pass transistor 13 is directly connected to the output terminal 11. Thus, the first delivering terminal 14 is coupled via a series circuit comprising the first mirror transistor 30, the further pass transistor 33 and the first pass transistor 13 to the output terminal 11. The number of transistors between the first current mirror 12 and the output terminal 11 is smaller than or equal to 2. In the embodiment shown in FIG. 2A, the number is exactly 2.

The number of transistors between the first delivering terminal 14 and the output terminal 11 is smaller than or equal to 3. In the embodiment shown in FIG. 2A, said number is exactly 3.

The first pass transistor 13 is realized as a field-effect transistor. The first pass transistor 13 may be fabricated as an n-channel field-effect transistor. A bulk terminal of the first pass transistor 13 is connected to a first node 37 between the first pass transistor 13 and the first current mirror 12. The bulk terminal can also be named substrate terminal. Thus, the bulk terminal of the first pass transistor 13 is connected to the first node 37 between the first pass transistor 13 and the further pass transistor 33. The bulk terminal of the further pass transistor 33 may also be connected to the first node 37.

A first node switch 34 of the output circuit 10 couples the first node 37 to a first common terminal 35. A first control switch 36 of the output circuit 10 couples the first common terminal 35 to a control terminal of the first pass transistor 13. A control terminal of the further pass transistor 33 is connected to the control terminal of the first pass transistor 13.

Moreover, the output circuit 10 comprises a first control path 40. The first control path 40 is arranged between the first delivering terminal 14 and the first common terminal 35. The first control path 40 comprises a first series circuit 41 of a first control transistor 42 and at least a first diode 43. The first series circuit 41 may comprise a further diode 44. A control terminal of the first control transistor 42 is connected to the first node 37. The first series circuit 41 couples the control terminal of the first pass transistor 13 to the first common terminal 35.

Moreover, the first control path 40 comprises a first current source 47 that couples the first delivering terminal 14 to the first series circuit 41. The first current source 47 may comprise a first current source element 48 and a first current switch 49 that are arranged in series between the first delivering terminal 14 and the first series circuit 41.

Moreover, the output circuit 10 comprises a control circuit 26 having outputs connected to the control terminals of the first node switch 34, the first control switch 36 and the first current source 47 and, thus, to a control terminal of the first current switch 49.

A first common voltage VC1 can be tapped at the first common terminal 35.

The control circuit 26 generates the first digital signal S2 and provides it to the control terminal of the first current source 47. A further digital signal S5 is provided by the control circuit 26 to the control terminals of the first node switch 34 and of the first control switch 36. The further digital signal S5 is the inverse signal of the first digital signal S2.

The first current switch 49 and, thus, also the first current source 47 are set in a conducting state by the first digital signal S2 when the output circuit 10 is set in the source operating mode. Thus, in the source operating mode, the first node switch 34 and the first control switch 36 are in a non-conducting state. The first pass transistor 13 and the further pass transistor 33 are controlled by a first series voltage VS1 that can be tapped across the first series circuit 41. The first control transistor 42 is controlled by a first node voltage VN1 that can be tapped at the first node 37.

A first current I1 that flows through the first mirror source 32 determines the current flowing through the further mirror transistor 31 and consequently also through the first mirror transistor 30. Thus, the first current I1 sets the current flowing from the first delivering terminal 14 to the output terminal 11. The first current I1 controls the output current IOUT. The current driving capability of the first mirror transistor 30 and of the further mirror transistor 31 may be equal. Thus, in this case, the value of the output current IOUT is equal to the value of the first current I1.

Alternatively, the first mirror transistor 30 has an M-fold current driving capability in comparison to the further mirror transistor 31. In this case the value of the output current IOUT is M-fold of the value of the first current T1.

The first voltage V1 may be realized as a source voltage. The first current T1 may be implemented as a source current. Thus, the output circuit 10 may be realized as a current source. The first voltage V1 may be positive with respect to the first common voltage VC1. The output current IOUT that flows from the output terminal 11 towards the not-shown load 20 has a positive value.

The first common voltage VC1 may be realized as a reference potential or ground potential or may be a voltage between the first voltage V1 and the reference potential. For example, the first common voltage VC1 may be lower than the first voltage V1 minus one or two Volt. For example, the first common terminal 35 may be directly and permanently connected to a reference potential terminal or ground terminal.

Double n-channel metal-oxide-semiconductor transistors 13, 33, abbreviated n-MOS transistors, are used to allow reverse polarity conditions and act as overvoltage protection. Due to the series configuration, those transistors 13, 33 may be rather large in order to achieve a decent ON-resistance of the output circuit 10.

Advantageously, a voltage is provided to the bulk terminal of the first pass transistor 13 that avoids a diode current between the bulk terminal and the first terminal and a diode current between the bulk terminal and the second terminal of the first pass transistor 13. A diode current inside the further pass transistor 33 is also avoided.

If the first pass transistor 13 is an n-channel field-effect transistor, a negative voltage is applied to the bulk terminal with respect to the first and the second terminal of the first pass transistor 13.

Figure 2B:
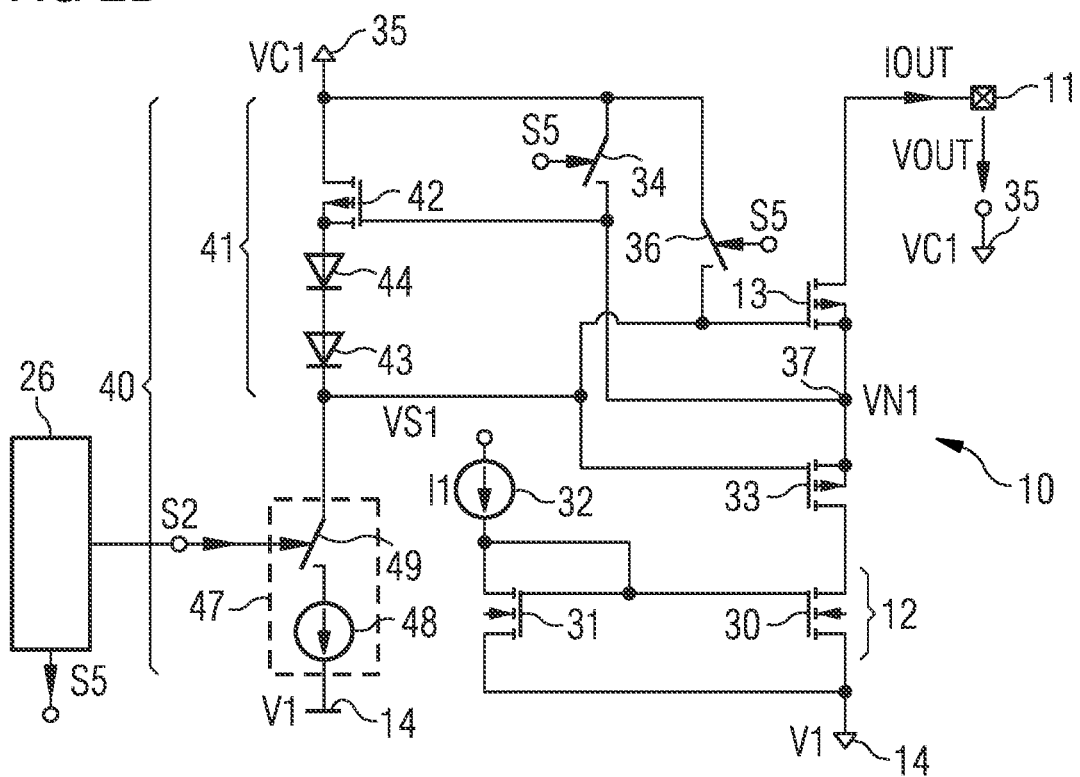

FIG. 2B shows a further exemplary embodiment of the output circuit 10 which is a further development of the above-shown embodiments. The first pass transistor 13 is realized as a p-channel field-effect transistor. The further pass transistor 33 is also realized as a p-channel field-effect transistor. The first mirror transistor 30 and the further mirror transistor 31 are realized as n-channel field-effect transistors.

The output circuit 10 is implemented as a current sink. The first common voltage VC1 that can be tapped at the first common terminal 35 may be realized as a positive voltage such as Vmax. The first common voltage VC1 may be the highest voltage that is provided to the output circuit 10. For example, the first common voltage VC1 may be a supply voltage VDD. The first voltage V1 that can be tapped at the first delivering terminal 14 may be implemented as a Vsink voltage. The first voltage V1 may be, for example, equal to a reference potential. The first voltage V1 is negative with respect to the first common voltage VC1.

Since the first pass transistor 13 is a p-channel field-effect transistor, a positive voltage is applied to the bulk terminal with respect to the first and the second terminal of the first pass transistor 13.

Figure 2C:
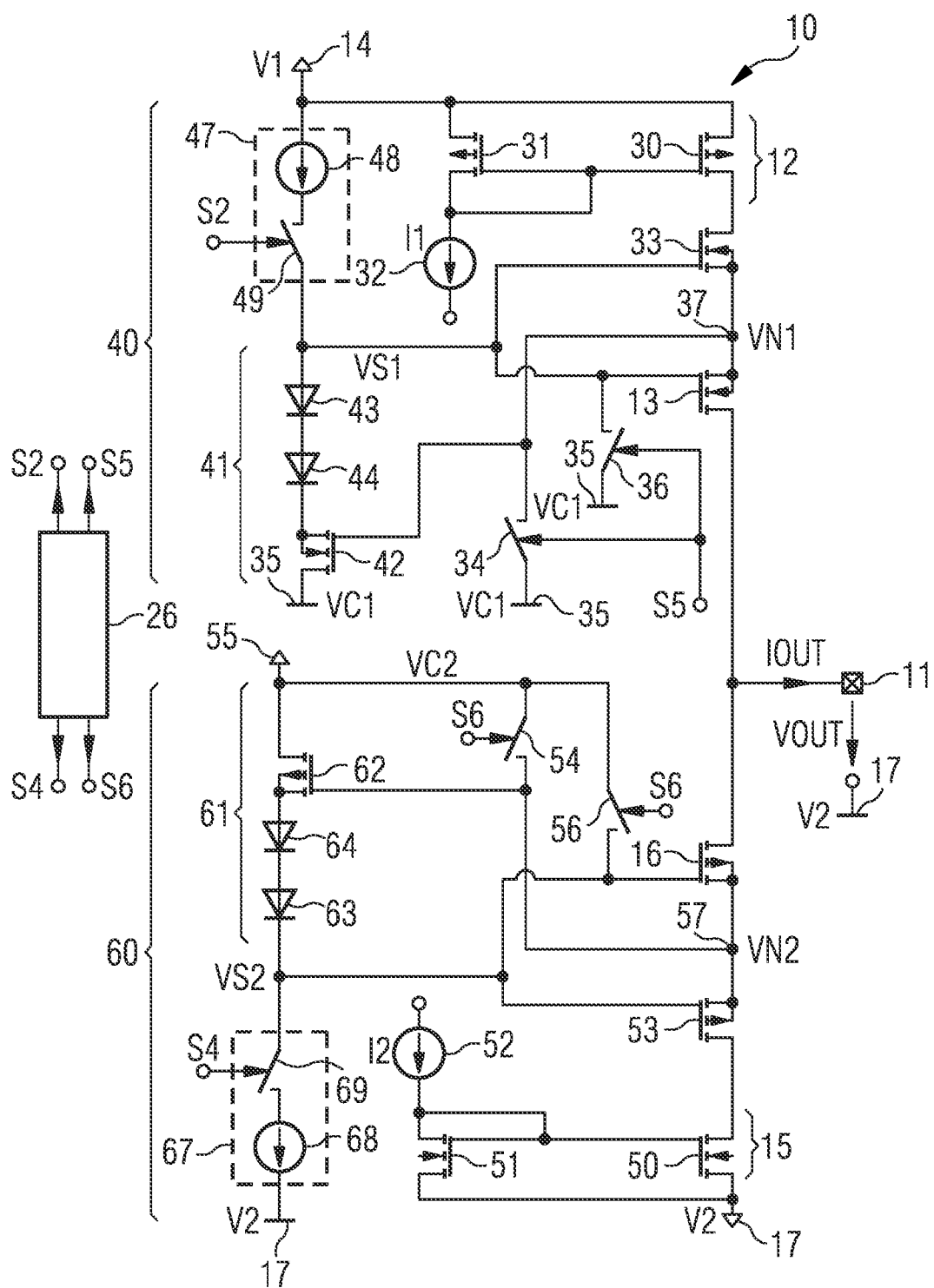

FIG. 2C shows a further exemplary embodiment of the output circuit 10 which is a further development of the above-shown embodiments. The upper part of the output circuit 10 shown in FIG. 2C is equal to the output circuit 10 illustrated by FIG. 2A. The output circuit 10 comprises the current source illustrated by FIG. 2A.

The output circuit 10 comprises a second current mirror 15 and the second pass transistor 16 that are arranged in a current path between the output terminal 11 and the second delivering terminal 17. Thus, the second current source circuit 19 shown in FIGS. 1A and 1B is implemented as the second current mirror 15. The second current mirror 15 is connected to the second delivering terminal 17. The second current mirror 15 comprises a second mirror transistor 50 and an additional mirror transistor 51. A first terminal of the second mirror transistor 50 and a first terminal of the additional mirror transistor 51 are connected to the second delivering terminal 17. The control terminals of the second mirror transistor 50 and of the additional mirror transistor 51 are connected to each other and to a second terminal of the additional mirror transistor 51. Moreover, the output circuit 10 comprises a second mirror source 52 that is connected to the second terminal of the additional mirror transistor 51.

The second pass transistor 16 is connected to the output terminal 11. Additionally, the output circuit 10 comprises an additional pass transistor 53 that is arranged between the second pass transistor 15 and the second current mirror 15. A second terminal of the second mirror transistor 50 is coupled to a first terminal of the second pass transistor 16 via the additional pass transistor 53. A second terminal of the second pass transistor 16 is directly connected to the output terminal 11. Thus, the second delivering terminal 17 is coupled via a series circuit comprising the second mirror transistor 50, the additional pass transistor 53 and the second pass transistor 16 to the output terminal 11. The number of transistors between the second current mirror 15 and the output terminal 11 is smaller than or equal to 2. In the embodiment shown in FIG. 2C, the number is exactly 2.

The number of transistors between the second delivering terminal 17 and the output terminal 11 is smaller than or equal to 3. In the embodiment shown in FIG. 2C, said number is exactly 3.

The second pass transistor 16 is realized as a field-effect transistor. The second pass transistor 16 may be designed as a p-channel field-effect transistor. A bulk terminal of the second pass transistor 16 is connected to a second node 57 between the second pass transistor 15 and the second current mirror 15. Thus, the bulk terminal of the second pass transistor 16 is connected to the second node 57 between the second pass transistor 16 and the additional pass transistor 53. The bulk terminal of the additional pass transistor 53 may also be connected to the second node 57.

A second node switch 54 of the output circuit 10 couples the second node 57 to a second common terminal 55. A second control switch 56 of the output circuit 10 couples the second common terminal 55 to a control terminal of the second pass transistor 16. A control terminal of the additional pass transistor 53 is connected to the control terminal of the second pass transistor 16.

Moreover, the output circuit 10 comprises a second control path 60. The second control path 60 is arranged between the second delivering terminal 17 and the second common terminal 55. The second control path 60 comprises a second series circuit 61 of a second control transistor 62 and at least a second diode 63. The second series circuit 61 may comprise an additional diode 64. A control terminal of the second control transistor 62 is connected to the second node 57. The second series circuit 61 couples the control terminal of the second pass transistor 16 to the second common terminal 55.

Furthermore, the second control path 60 comprises a second current source 67 that couples the second delivering terminal 17 to the second series circuit 61. The second current source 67 may comprise a second current source element 68 and a second current switch 69 that are arranged in series between the second delivering terminal 17 and the second series circuit 61.

Moreover, the control circuit 26 comprises outputs connected to the control terminals of the second node switch 54, the second control switch 56 and the second current source 67 and, thus, to a control terminal of the second current switch 69.

The second mirror transistor 50 and the additional mirror transistor 51 are realized as n-channel field-effect transistors. A second common voltage VC2 is tapped at the second common terminal 55.

The control circuit 26 generates the second digital signal S4 and provides it to the control terminal of the second current source 67. Thus, the second current switch 69 and, thus, also the second current source 67 are set in a conducting state by the second digital signal S4, when the output circuit 10 is set in the sink operating mode. An additional digital signal S6 is provided by the control circuit 26 to the control terminals of the second node switch 54 and of the second control switch 56. The additional digital signal S6 is the inverse signal of the second digital signal S4. Thus, in the sink operating mode, the second node switch 54 and the second control switch 56 are in a non-conducting state.

Thus, the second pass transistor 16 and the additional pass transistor 53 are controlled by a second series voltage VS2 that can be tapped across the second series circuit 61. The second control transistor 62 is controlled by a second node voltage VN2 that can be tapped at the second node 57. A second current I2 that flows through the second mirror source 52 determines the current flowing through the additional mirror transistor 51 and consequently also through the second mirror transistor 50. Thus, the second current I2 sets the current flowing from the second delivering terminal 17 to the output terminal 11. The second current I2 controls the output current IOUT. The current driving capability of the second mirror transistor 50 and of the additional mirror transistor 51 may be equal. Thus, in this case, a value of the output current IOUT is equal to a value of the second current I2.

Alternatively, the second mirror transistor 50 has an M-fold current driving capability in comparison to the additional mirror transistor 51. In this case the value of the output current IOUT is M-fold of the value of the second current I2.

The second voltage V2 may be realized as a sink voltage. The second current I2 may be implemented as a sink current. Thus, the lower part of the output circuit 10 may be realized as a current sink. The second voltage V2 may be negative with respect to the second common voltage VC2.

The first common voltage VC1 may be realized as a reference potential or ground potential or may be a voltage between the first voltage V1 and the reference potential. For example, the first common voltage VC1 may be lower than the first voltage V1 minus one or two Volt. For example, the first common terminal 35 may be directly and permanently connected to a reference potential terminal or ground terminal.

The second common voltage VC2 may be realized as a positive voltage such as Vmax. The second common voltage VC2 may be the highest voltage that is provided to the output circuit 10. For example, the second common voltage VC2 may be the supply voltage VDD. The second voltage V2 may be implemented as a Vsink voltage. The second voltage V2 may be, for example, equal to a reference potential.

Figure 3A:
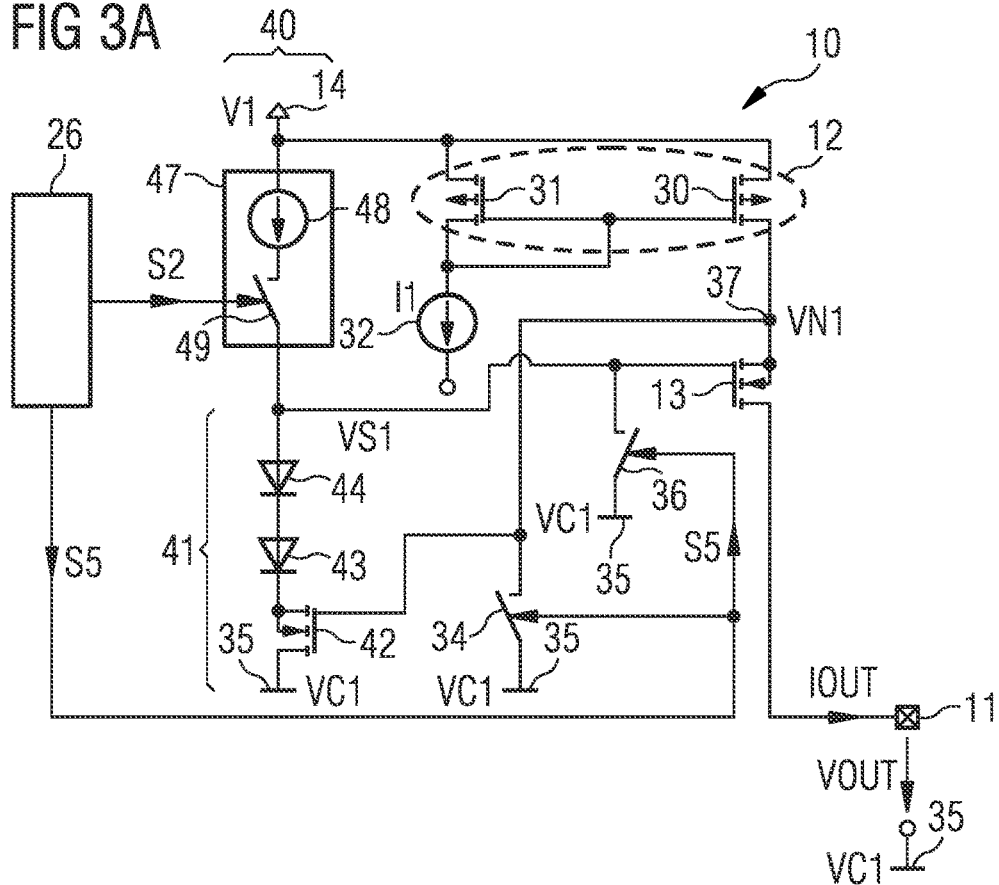
FIGS. 3A to 3C show three further exemplary embodiments of an output circuit.

FIG. 3A shows a further exemplary embodiment of the output circuit 10 which is a further development of the above-shown embodiments. The output circuit 10 is free from the further pass transistor 33. Thus, only the first pass transistor 13 couples the first current mirror 12 to the output terminal 11. The second terminal of the first mirror transistor 30 is directly and permanently connected to the first terminal of the first pass transistor 13. The number of transistors between the first current mirror 12 and the output terminal 11 is exactly one. The number of transistors between the first delivering terminal 14 and the output terminal 11 may be exactly two. A series circuit consisting of the first current mirror 12 and the first pass transistor 13 is directly and permanently connected on one side to the first delivering terminal 14 and on the other side to the output terminal 11. A series circuit consisting of the first mirror transistor 30 and the first pass transistor 13 connects the first delivering terminal 14 to the output terminal 11. The series circuit consisting of the first mirror transistor 30 and the first pass transistor 13 is directly and permanently connected on one side to the first delivering terminal 14 and on the other side to the output terminal 11. The first node 37 is directly connected to the second terminal of the first mirror transistor 30 and to the first terminal of the first pass transistor 13.

The output terminal 11 is directly and permanently connected to the load 20. The output circuit 10 directly provides the output current IOUT to the load 20 via the output terminal 11.

The first delivering terminal 14 may be directly and permanently connected to a not shown voltage source. The voltage source may be a battery, a voltage converter or a charge pump.

The voltage source may generate the first voltage V1 that is provided to the output circuit 10 via the first delivering terminal 14.

Advantageously, one of the large back-to-back n-MOS transistors is eliminated. Thus, the on-resistance of the output circuit 10 is reduced.

Figure 3B:
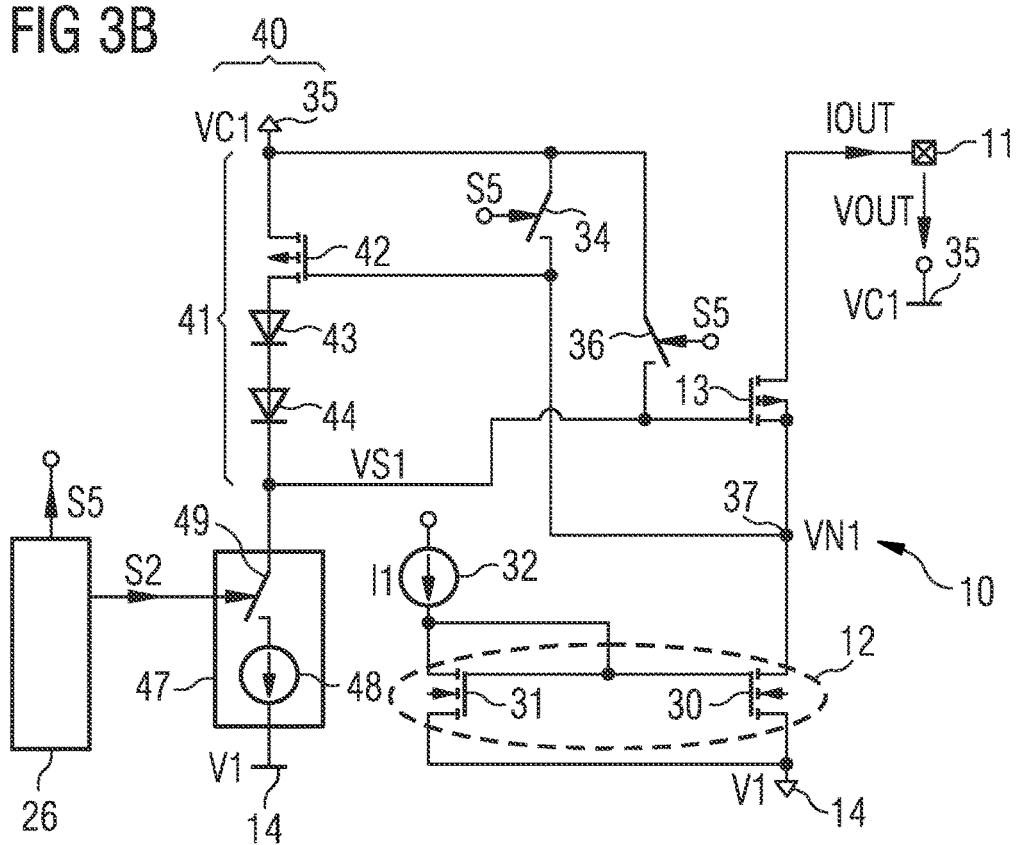

FIG. 3B shows a further embodiment of the output circuit that is a further development of the above-shown embodiments, especially as shown in FIG. 2B and FIG. 3A. The first delivering terminal 14 may be directly and permanently connected to a not shown voltage source. Alternatively, the first delivering terminal 14 may be directly and permanently connected to a reference potential terminal or ground terminal. The reference potential terminal or ground terminal provides the first voltage V1 that is implemented as a reference potential or ground potential to the output circuit 10 via the first delivering terminal 14.

Figure 3C:
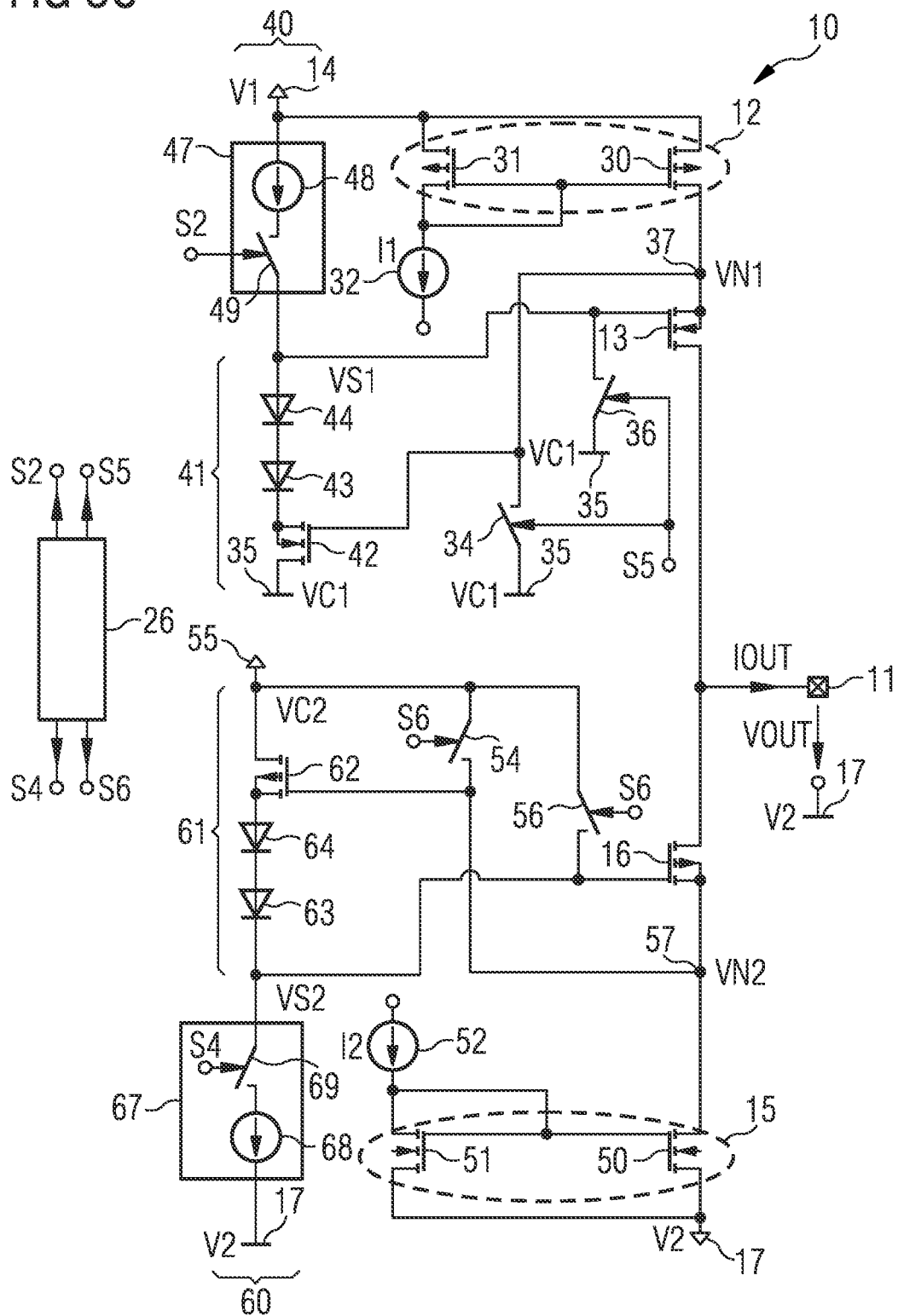

FIG. 3C shows a further exemplary embodiment of the output circuit 10 that is a further development of the above-shown embodiments, especially as shown in FIG. 2C and FIGS. 3A and 3B. The output circuit 10 is free from the additional pass transistor 53. Thus, only the second pass transistor 16 couples the second current mirror 15 to the output terminal 11. The second terminal of the second mirror transistor 50 is directly and permanently connected to the first terminal of the second pass transistor 16. The number of transistors between the second current mirror 15 and the output terminal 11 is exactly one. The number of transistors between the second delivering terminal 17 and the output terminal 11 may be exactly two. A series circuit consisting of the second current mirror 15 and the second pass transistor 16 is directly and permanently connected on one side to the second delivering terminal 17 and on the other side to the output terminal 11. A series circuit consisting of the second mirror transistor 50 and the second pass transistor 16 connects the second delivering terminal 17 to the output terminal 11. The series circuit consisting of the second mirror transistor 50 and the second pass transistor 16 is directly and permanently connected on one side to the second delivering terminal 17 and on the other side to the output terminal 11. The second node 57 is directly connected to the second terminal of the second mirror transistor 50 and to the first terminal of the second pass transistor 16.

The second delivering terminal 17 may be directly and permanently connected to a not shown further voltage source. The further voltage source may be a battery, a voltage converter or a charge pump. The further voltage source may generate the second voltage V2 that is provided to the output circuit 10 via the second delivering terminal 17. Alternatively, the second delivering terminal 17 may be directly and permanently connected to a reference potential terminal or ground terminal. The reference potential terminal or ground terminal provides the second voltage V2 that is implemented as a reference potential or ground potential to the output circuit 10 via the second delivering terminal 17.

The output circuit 10 may operate in three operating modes or phases: the output circuit 10 can operate as a current source in the source operating mode or as a current sink in the sink operating mode or can be in an idle state or idle mode. The control circuit 26 sets the selected operating mode or phase.

The first pass transistor 13 is realized as a blocking transistor and fabricated as n-channel transistor. The second pass transistor 16 is also realized as a blocking transistor and fabricated as p-channel transistor.

In the off-state gate, the bulk and source of the first pass transistor 13 are connected to the lowest voltage. The bulk and source of the second pass transistor 16 are connected to the highest voltage. This prevents the parasitic-well diode of the first and the second current mirror 12, 15 from getting reverse-biased. In the active state, the gate of the first pass transistor 13 is set to several threshold voltages higher than the bulk/source node and is turned on. Once turned on, the Vgate_bulk/source can follow the drain-node across nearly the entire voltage range and keeps the first pass transistor 13 on. The second pass transistor 16 operates in a corresponding manner.

Advantageously, one of the large back-to-back n-MOS pass transistors 13, 33 is eliminated. Also one of the large back-to-back p-MOS pass transistors 16, 53 is eliminated. Thus, the area of the output circuit 10 on a semiconductor body is reduced. Also the on-resistance is reduced. No additional signals are needed. No extra bias voltages are needed. Moreover, no special process/process options are needed. Any voltage may be allowed at the output terminal 11 by process.

In an alternative embodiment, not shown, the first current mirror 12 can be realized by another current mirror structure that comprises e.g. a p-MOS device. The second current mirror 15 can be realized by another current mirror structure that comprises e.g. an n-MOS device.

In an alternative, not shown embodiment, the output circuit 10 comprises at least a further upper part of the output circuit shown in FIG. 3C. Thus, the output circuit 10 comprises at least a further first current mirror and at least a further first pass transistor connected and controlled such as shown in FIGS. 3A and 3C. Thus, the output circuit 10 comprises at least a further current source. The characteristics of the current sources may be different.

In an alternative, not shown embodiment, the output circuit 10 comprises at least one further lower part of the output circuit 10 shown in FIG. 3C. Thus, the output circuit 10 comprises at least a further second current mirror and at least a further second pass transistor connected and controlled such as shown in FIG. 3C. Thus, the output circuit 10 comprises at least a further current sink. The characteristics of the current sinks may be different.

Figure 4A:
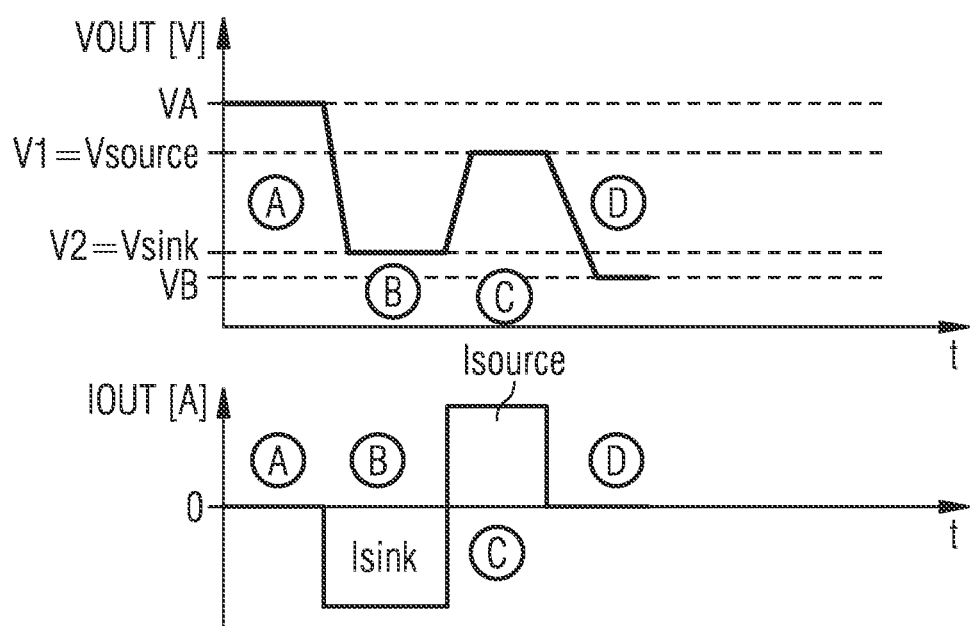
FIGS. 4A and 4B show exemplary signals of an output circuit.

FIG. 4A shows an exemplary embodiment of signals of the output circuit 10 e.g. shown in FIGS. 1A, 1B, 2C and 3C. The output current IOUT and the output voltage VOUT that can be tapped at the output terminal 11 are shown as a function of the time t.

In a first phase A, the output circuit 10 is in an idle state or idle mode. The first load switch 21 is set in a conducting state and, thus, the first load voltage VA provided by the first load voltage source 22 is applied to the output terminal 11. Thus, the output current IOUT is zero in the first phase A. The first and the second pass transistors 13, 16 block the output current IOUT in the idle state of the output circuit 10 shown in FIGS. 2A to 2C. The first pass transistor 13 blocks the output current IOUT in the idle state of the output circuit 10 shown in FIGS. 3A to 3C. This is the case, even if the output voltage VOUT is higher than the first voltage V1. As shown in FIG. 4A, the first load voltage VA being higher than the first voltage V1 results in a zero output current IOUT. Alternatively, the output current IOUT has a negligible small value in the idle state.

In a second phase B, the output circuit 10 is in the sink operating mode and operates as a current sink. Thus, the output current IOUT has a negative value Isink. The value of the output current IOUT is kept approximately constant by the output circuit 10. The output voltage VOUT drops to the second voltage V2 that can be named as voltage Vsink.

In a third phase C, the output circuit 10 is in the source operating mode and operates as a current source. Thus, the output current IOUT has a positive value Isource. The value of the output current IOUT is maintained approximately constant by the output circuit 10. The output voltage VOUT rises up to the first voltage V1 that can be named voltage Vsource.

The constant value of the output current IOUT is mainly achieved by the first and/or the second current mirror 12, 15, shown in FIGS. 2C and 3C, or the first and/or the second current source circuit 18, 19, shown in FIGS. 1A and 1B.

In a fourth phase D, the output circuit 10 is in the idle state. The second load switch 23 is in a conducting state and couples the second load voltage source 24 to the output terminal 11. Thus, the output voltage VOUT is equal to the second load voltage VB. The first and the second pass transistors 13, 16 again block the output current IOUT in the idle state of the output circuit 10. Thus, the output current IOUT is zero.

The first and the second voltage V1, V2 may follow the equations:

$$V\text{max} > V1 = V\text{source}$$

$$V1 = V\text{source} \geq V\text{sink} = V2$$

$$V2 = V\text{sink} > VSS$$

The first voltage V1 is realized as a current-source supply Vsource. The second voltage V2 is implemented as a current-sink supply Vsink. The voltage Vmax may be the highest voltage that is provided to the output circuit 10. The voltage VSS may be the lowest voltage that is provided to the output circuit 10.

The first and the second load voltage VA, VB and the first and the second voltage V1, V2 may follow the equations:

$$VA > V1 = V\text{source}$$

$$V2 = V\text{sink} > VB$$

Alternatively, the first load voltage VA may be between the first and the second voltage V1, V2. The second load voltage VB may be between the first and the second voltage V1, V2.

In FIG. 4A, an example of a switching scheme is shown in which the output terminal 11 can be driven higher than Vsource and lower than Vsink without causing damage or malfunction. During the first and the fourth phase A, D, the device under test, abbreviated DUT, is disconnected and the output voltage VOUT can be supplied higher than the first voltage V1 (the current-source supply Vsource) or lower than the second voltage V2 (the current-sink supply Vsink). In the second phase B, the circuit sink is activated to provide current to the second delivering terminal 17 (Vsink), and in the third phase C, current is provided from the first delivering terminal 14 (Vsource).

Figure 4B:
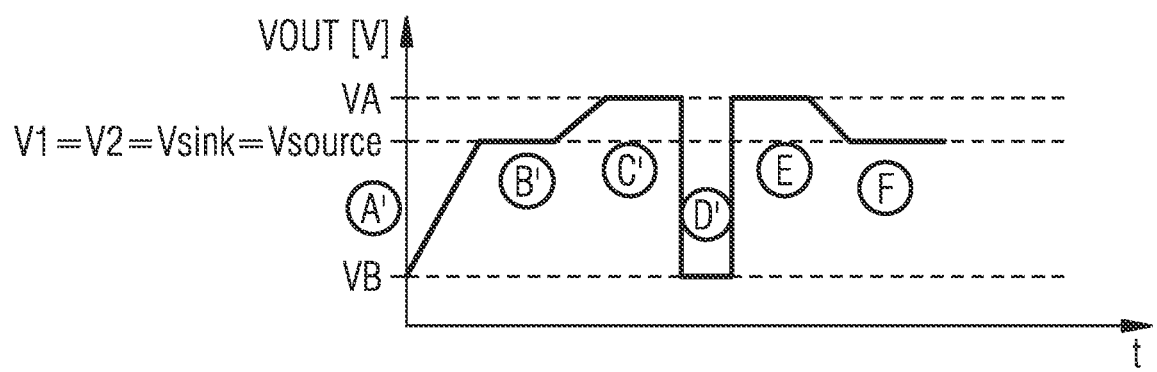

FIG. 4B shows an exemplary embodiment of signals of the output circuit 10 over the time t. In this example, the first voltage V1 and the second voltage V2 are equal. As shown in FIG. 4B, the voltage Vsink and the voltage Vsource have the same potential. For the time t<0, the output circuit 10 is in a first phase A' and is in the idle mode. The second load switch 23 is in a conducting state and the second load voltage VA is applied to the load 20 and, thus, to the output terminal 11.

At time t=0, there is a transition from the first phase A' to a second phase B'. In the second phase B', the output circuit 10 is in the source operating mode. The source operating mode may be equal to the sink operating mode. Thus, the output voltage VOUT rises from the second load voltage VB to the first voltage V1. The slope of the output voltage VOUT is a function of the output current IOUT and of a capacitance value of the capacitor 25 or of another capacitive load.

After the second phase B', there is a transition into a third phase C', in which the output circuit 10 is in the idle mode. The output voltage VOUT rises from the first voltage V1 to the first load voltage VA.

In a fourth phase D', starting after the third phase C', the output circuit 10 continues to be in the idle mode and the second load voltage VB is provided to the load 20.

In a fifth phase E, starting after the fourth phase D', the output circuit 10 still is in the idle mode. The output voltage VOUT rises from the second load voltage VB to the first load voltage VA.

The transition times between the third phase C', the fourth phase D' and the fifth phase E are very short, since the first and the second voltage source 22, 24 are able to immediately set the output voltage VOUT on the values of the first and the second load voltage VA, VB.

In a sixth phase F, the output circuit 10 is in the source operating mode. In a transition phase between the fifth phase E and the sixth phase F, the output voltage VOUT decreases from the first load voltage VA to the first voltage V1. The slope of the output voltage VOUT is a function of the output current IOUT and of a capacitance value of the capacitor 25 or of another capacitive load.

The invention claimed is:

1. An output circuit, comprising:
    an output terminal,
    a first current mirror,
    a first pass transistor,
    a first delivering terminal coupled via the first current mirror and the first pass transistor to the output terminal, and
    a first control path having a first series circuit of a first control transistor and at least a first diode,
    wherein the first series circuit couples a control terminal of the first pass transistor to a first common terminal, and
    wherein the first control path comprises a first current source that couples the first delivering terminal to the first series circuit.

2. The output circuit according to claim 1,
    wherein the first current mirror is connected to the first delivering terminal and the first pass transistor is connected to the output terminal.

3. The output circuit according to claim 1,
    wherein the first current mirror comprises a first mirror transistor and a further mirror transistor,
    wherein a first terminal of the first mirror transistor and a first terminal of the further mirror transistor are connected to the first delivering terminal,
    wherein a control terminal of the first mirror transistor is connected to a control terminal of the further mirror transistor and to a second terminal of the further mirror transistor,
    wherein a series circuit of the first mirror transistor and of the first pass transistor couples the first delivering terminal to the output terminal, and
    wherein the output circuit comprises a first mirror source that is connected to the second terminal of the further mirror transistor.

4. The output circuit according to claim 3,
    wherein the first mirror transistor and the further mirror transistor are fabricated as p-channel field-effect transistors and the first pass transistor is fabricated as an n-channel field-effect transistor, or the first mirror transistor and the further mirror transistor are realized as n-channel field-effect transistors and the first pass transistor is realized as a p-channel field-effect transistor.

5. The output circuit according to claim 1,
wherein the number of transistors between the first current mirror and the output terminal is exactly one.

6. The output circuit according to claim 1,
wherein the first pass transistor is realized as a field-effect transistor having a bulk terminal that is connected to a first node between the first pass transistor and the first current mirror.

7. The output circuit according to claim 6,
comprising a first control switch that couples a first common terminal to a control terminal of the first pass transistor.

8. The output circuit according to claim 1,
comprising a first node switch that is arranged between a first common terminal and a first node between the first pass transistor and the first current mirror.

9. The output circuit according to claim 1,
wherein a control terminal of the first control transistor is connected to the first node.

10. The output circuit according to claim 1,
wherein the output circuit is configured such that the first pass transistor blocks the output current in an idle state of the output circuit, independent whether an output voltage that is tapped at the output terminal is higher or lower than a first voltage that is provided to the first delivering terminal.

11. The output circuit according to claim 1,
wherein the first current mirror and the first pass transistor form a current source.

12. The output circuit according to claim 11,
wherein the first delivering terminal is realized as a source terminal, the first current mirror is implemented by p-channel field effect transistors and the first pass transistor is implemented as an n-channel field-effect transistor.

13. The output circuit according to claim 11,
comprising a second current mirror, a second pass transistor and a second delivering terminal coupled via the second current mirror and the second pass transistor to the output terminal,
wherein the second current mirror and the second pass transistor form a current sink.

14. The output circuit according to claim 1,
wherein the first current mirror and the first pass transistor form a current sink.

15. A method for providing an output current using the output circuit according to claim 1, the method comprising:
controlling the output current by the first current mirror and the first pass transistor, and
providing the output current at the output terminal.

16. The method according to claim 15, further comprising:
blocking, by the first pass transistor, the output current in an idle state of the output circuit, independent whether an output voltage that is tapped at the output terminal is higher or lower than a first voltage that is provided to the first delivering terminal.

* * * * *